United States Patent
Ott et al.

(10) Patent No.: US 7,169,715 B2
(45) Date of Patent: Jan. 30, 2007

(54) FORMING A DIELECTRIC LAYER USING POROGENS

(75) Inventors: Andrew W. Ott, Hillsboro, OR (US); Grant M. Kloster, Lake Oswego, OR (US); Robert P. Meagley, Hillsboro, OR (US); Michael D. Goodner, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/394,104

(22) Filed: Mar. 21, 2003

(65) Prior Publication Data

US 2004/0185679 A1    Sep. 23, 2004

(51) Int. Cl.
*H01L 21/31* (2006.01)
*H01L 21/469* (2006.01)

(52) U.S. Cl. .............. 438/780; 257/E21.267
(58) Field of Classification Search ........ 438/780
See application file for complete search history.

(56) References Cited

U.S. PATENT DOCUMENTS

| 5,872,401 | A | 2/1999 | Huff et al. ............ 257/758 |
| 5,950,107 | A | 9/1999 | Huff et al. ............ 438/669 |
| 6,284,149 | B1 * | 9/2001 | Li et al. ............ 216/64 |
| 6,312,793 | B1 * | 11/2001 | Grill et al. ............ 428/312.6 |
| 6,329,118 | B1 | 12/2001 | Hussein et al. ............ 430/270.1 |
| 6,541,398 | B2 * | 4/2003 | Grill et al. ............ 438/780 |
| 6,562,416 | B2 * | 5/2003 | Ngo et al. ............ 427/534 |
| 2002/0037442 | A1 * | 3/2002 | Grill et al. ............ 428/698 |
| 2002/0137359 | A1 * | 9/2002 | Grill et al. ............ 438/778 |
| 2003/0234450 | A1 * | 12/2003 | Grill et al. ............ 257/759 |

OTHER PUBLICATIONS

U.S. Appl. No. 10/337,061, filed Feb. 28, 2003, Meagley et al.
Grill, Alfred. Plasma enhanced chemical vapor deposited SiCOH dielectrics: from low-k to extreme low-k interconnect materials. Journal of Applied Physics, vol. 93, No. 3. Feb. 1, 2003.
Hendricks, Neil H., Ph.D. Innovations in Interconnect Technology. Jul. 16, 2001. http://www.semi.org.
Chapman, Lance. International SEMATECH Fabricates Electrically Yielding 2-Level Metal Copper Dual Damascene Via Chains with NANOGLASS® E Extra Low-k Spin-On Dielectric. Synnyvale, California, Nov. 14, 2001.

* cited by examiner

*Primary Examiner*—Fernando L. Toledo
(74) *Attorney, Agent, or Firm*—Trop, Pruner & Hu, P.C.

(57) ABSTRACT

In one embodiment, the present invention includes introducing a conventional precursor and an organic precursor having an organic porogen into a vapor deposition apparatus; and forming a dielectric layer having the organic porogen on a substrate within the vapor deposition apparatus from the precursors. In certain embodiments, at least a portion of the organic porogen may be removed after subsequent processing, such as dual damascene processing.

20 Claims, 3 Drawing Sheets

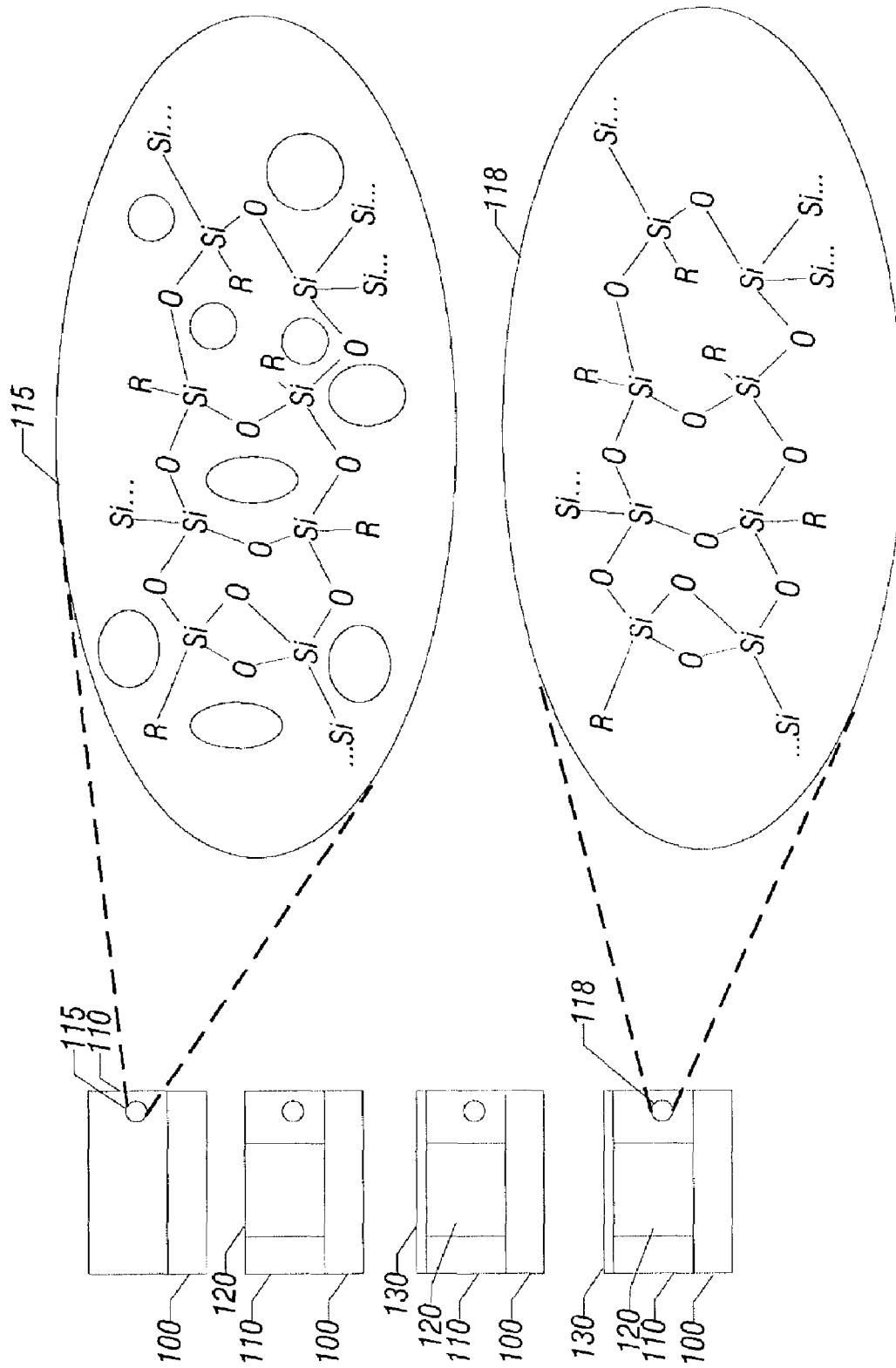

FORMING A DIELECTRIC LAYER USING POROGENS

BACKGROUND

The present invention relates to forming layers on a substrate and more particularly to forming a dielectric layer using porogens.

Semiconductor devices typically include metal layers that are insulated from each other by dielectric layers. It is desirable that these dielectric layers which are made of an insulative material have a relatively low dielectric constant. While such dielectric layers may be made of various materials, silicon dioxide is one material used, however it has a relatively high dielectric constant. One material used to provide a low dielectric constant ($K_{eff}$) is a carbon doped oxide (CDO). Typically, CDO films are formed using a vapor deposition process. It is desirable however, to obtain a dielectric layer having a lower $K_{eff}$ than possible using a vapor deposition process. Thus there is a need for a dielectric layer that has reliable mechanical strength to withstand subsequent processing and a relatively low dielectric constant upon device completion.

BRIEF DESCRIPTION OF THE DRAWINGS

FIG. 1A is a partial cross-section of a substrate having a dielectric layer formed thereon containing an organic porogen in accordance with one embodiment of the present invention.

FIG. 1B is a partial cross-section of a substrate having a dielectric layer with a metal interconnect formed therein in accordance with one embodiment of the present invention.

FIG. 1C is a partial cross-section of a substrate having a permeable layer formed over the dielectric layer in accordance with one embodiment of the present invention.

FIG. 1D is a partial cross-section of a substrate having a dielectric layer with organic porogens removed in accordance with one embodiment of the present invention.

DETAILED DESCRIPTION

Figure 2C:
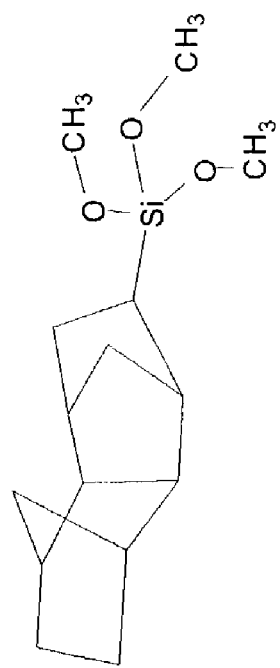
FIGS. 2A–2C are chemical structures of precursors for use in accordance with various embodiments of the present invention.

In one embodiment of the present invention, multiple precursors may be co-deposited to form a dielectric layer or film (e.g., an interlayer dielectric (ILD)), such as a carbon-doped oxide matrix, with physically or chemically incorporated porogens. These porogens may be deposited using various techniques, including for example physical vapor deposition (PVD), chemical vapor deposition (CVD), or plasma enhanced chemical vapor deposition (PECVD).

In certain embodiments, a percentage of a porogen-containing precursor may be co-deposited with a conventional silicon oxide or CDO precursor (hereafter "conventional precursors"), which include, but are not limited to tetraethylorthosilicate (TEOS), TOMCATS, dimethyldimethoxysilane (DMDMOS), and OMCTS. The percentage of the porogen-containing precursor to conventional precursor may vary in different embodiments.

One example deposition may be thermal deposition of a porogen-containing precursor with a conventional molecular precursor such as TEOS, DMDMOS, and the like. Similarly, deposition may be accomplished via plasma assisted deposition of a porogen-containing precursor with a molecular precursor such as TEOS, DMDMOS, and the like. Alternately, the reaction of a porogen-containing precursor and a silane-based precursor with an oxygen source (such as oxygen or water), or a mixture of any of the above techniques may be used to deposit the dielectric layer.

Deposition of the dielectric layer may be accomplished using a conventional reaction chamber operating at conventional temperatures and pressures. In certain embodiments, the thickness of the deposited dielectric layer may be between approximately 500 Angstroms and approximately 10,000 Angstroms.

The porogen inclusions may provide the resulting dielectric layer with a relatively high mechanical strength. Such mechanical strength may be desired in certain embodiments for subsequent processing such as a dual damascene process. In certain embodiments, after desired subsequent processing has occurred, the porogen may be removed (hereafter referred to as "post-treatment") to form an ILD film with greater porosity and a lower dielectric constant.

In certain embodiments, the relative concentration of the precursors may be varied to control the porosity and physical properties of the ILD film as desired. For example, the relative concentration may be varied to optimize the mechanical strength before post-treatment or porosity of the film after post-treatment. In certain embodiments, the relative concentration of an organic precursor to a conventional precursor may vary between approximately 5% to approximately 50%. In other embodiments, the relative concentration of organic precursor to conventional precursor may extend to approximately 80%.

Referring now to FIGS. 1A to 1D, shown are partial cross-sections of structures which result after various processing steps in accordance with one embodiment of the present invention. As shown in FIG. 1A, a first layer 100 has formed thereon a dielectric layer 110. First layer 100 may be an underlying substrate or another layer, such as a conductive layer, for example, made of copper, copper alloy, aluminum, aluminum alloy or other conductive material. As shown in FIG. 1A in close-up 115, dielectric layer 110 may be formed of silicon oxide and sacrificial organic material (i.e., an organic porogen). At this stage, the dielectric constant of the film may be higher than the final target value. Note that while the figures show a porogen not chemically bonded to the silicon oxide matrix, as in accordance with one embodiment of the invention, other embodiments exist in which the porogen may be chemically bonded to the silicon oxide matrix or may form an inter-penetrating network with the silicon oxide matrix.

Referring now to FIG. 1B, dielectric layer 110 may be used as a substrate for subsequent processing. For example, a dual damascene process may be performed to form metal interconnects in dielectric layer 110. Such interconnects may be used to connect first layer 100 to a later deposited layer, such as a second conductive layer (not shown in FIG. 1B). FIG. 1B shows interconnect 120 formed in dielectric layer 110. In certain embodiments, a final planarization (e.g., chemical mechanical planarization) may be performed to remove excess metal.

In one embodiment, a permeable layer 130 may be applied on top of dielectric layer 110, as shown in FIG. 1C. In one embodiment, permeable layer 130 may be an etch stop material. Alternately, permeable layer 130 may be a permeable hardmask applied prior to patterning the dual damascene structure.

Referring now to FIG. 1D, dielectric layer 110 may be post-treated to remove the porogen, forming a porous film with a lower dielectric constant. As shown in close-up 118, the porogen has been removed, leaving a silicon oxide film with greater porosity. In various embodiments, removal may occur by thermal decomposition of the porogen, selective removal of the porogen using solvents or supercritical carbon dioxide ($CO_2$), exposure to irradiation (electron-beam, X-ray, ultraviolet (UV), infrared (IR), microwave, or the like), or otherwise.

In a thermal process, a relatively higher temperature may be used to remove the sacrificial organic material than the temperatures used in depositing the film. For example, in certain embodiments, a thermal process may occur at a temperature between approximately 260° Celsius (C.) to approximately 600° C., and in one embodiment, a temperature of approximately 500° C. may be used. This thermal process may occur for a duration of between approximately one minute to approximately two hours, in various embodiments.

In one embodiment, the porogen may be large organic molecules separately introduced into the deposition system via co-deposition. In certain embodiments, the molecules may exhibit the following properties: large volume; stable in a plasma (i.e., significant parent yield in a mass spectrometer); volatile (have high enough vapor pressure to be introduced into CVD systems); and susceptible to decomposition during later processing. The molecules may be ionized in a plasma or react in the gas phase. The molecules may also contain functional groups that are susceptible to reaction at the film surface. For film surface reactions, the organic molecules may either covalently bond to the surface or may physisorb on the surface. In either case, deposition continues around the organic moiety, trapping the organic porogen in the film until it is later removed during post-treatment.

In one embodiment, co-deposition may be effected with a conventional silane or TEOS-based precursor and a silicon-free organic precursor to form a silica network with organic materials incorporated into the backbone of the network or as sidechains on the network. In a second embodiment, co-deposition may be effected using a conventional silane or TEOS-based precursor with a self-polymerizing organic precursor which may form a silica network with oligomeric materials incorporated as side groups on the silica network or physical inclusions in the network (such as by surface reaction or physisorption). In other embodiments, variations between these systems, such as a moiety that may undergo self-polymerization or may be incorporated directly in the backbone or as a sidechain, may be used.

In one embodiment, the organic precursor may be a TEOS or silane-based precursor containing alkyl groups, benzene, naphthalene, anthracene, adamantane, norbornane, camphor, or norcamphor, and their derivatives. In a second embodiment, the organic precursors may be vinyl derivatives of the above-mentioned functional groups, such as vinyl adamantane. Similarly, epoxide, halogen, vinyl, or otherwise functionalized versions of the aforementioned moieties, to render them reactive in a PVD, CVD or PECVD system (e.g., idobenzene) may be used. Further, monomers that polymerize in PVD, CVD or PECVD systems to form included thermally decomposable polymers such as styrene, alpha-methyl styrene, and the like may be used. Polymers such as poly propylene oxide (PPO), polymethylstyrene (PMS), polyoxymethlene (POM), polyethretherketone (PEEK), polystyrene (PS), polyether sulfone (PES), and polyethylene terephthalate (PET), may also be used. More so, oligomers of such thermally decomposable polymers may be used. Similarly, other compounds, such as hydrocarbon cage moieties (e.g., norbornyl and adamantyl derivatives), aryl derivatives (e.g., phenyl and benzyl derivatives), cyclic derivatives, hydrocarbon derivatives (straight, branched, substituted), or moieties with functional groups and their derivatives may also be used.

In one embodiment, a precursor for co-deposition may have the general formula $[R_2]_{4-x}Si[R_1]_x$, where x equals one, two, or three; $R_1$ may be a functional group that forms Si—O bonds during deposition (i.e., a silanating/alkoxy silanating functional group), for example, H, a halogen, $OCH_3$, $OCH_2CH_3$, or an alkoxy; and $R_2$ may be of a bulky carbon-based functional group, for example, norbornyl, neopentyl, adamantyl, cyclopentadienyl, methyl adamantyl, an alicyclic, a heterocyclic, a branched alkyl, a straight chain alkyl, or an aromatic. In the case of x=1, more than one precursor may be used to build the film to promote bonding between precursor molecules during the deposition process.

In another embodiment, a precursor for co-deposition may have the general formula $[R_2X]_{4-x}Si[R_1]_x$, where X is a heteroatom, such as O, N, or S, for example; and x, $R_1$ and $R_2$ may be as above.

In certain embodiments, two precursors may be co-deposited that are each in accordance with one of the above general formulae. For example, one precursor having the first general formula may be co-deposited with a second precursor having the second general formula. Alternately, two precursors having the first general formula or two precursors having the second general formula may be co-deposited. In certain embodiments, the two precursors may include different functional groups. In still other embodiments, an organic precursor (as discussed above) may be co-deposited with a precursor in accordance with one of the above general formulae.

Figure 2B:
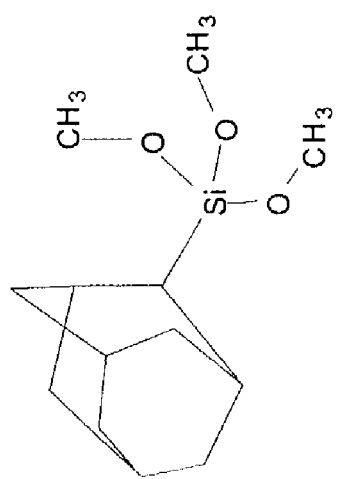
Figure 2A:
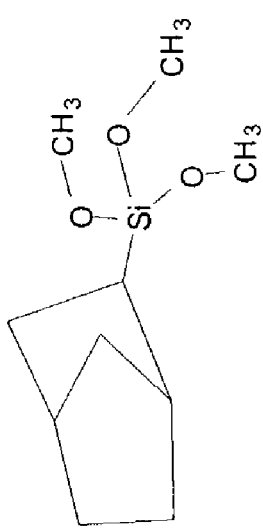

While many different precursors may be co-deposited in accordance with embodiments of the present invention, referring now to FIGS. 2A–2C, shown are example precursors for use in forming dielectric layers in accordance with particular embodiments of the present invention using co-deposition. As shown in FIG. 2A, in one embodiment a precursor may be norbornyl trimethoxysilane. As shown in FIG. 2B, in a second embodiment a precursor may be adamantyl trimethoxysilane. As shown in FIG. 2C, in a third embodiment a precursor may be dicyclopentadienyl trimethoxysilane. In other embodiments, such precursors may include trietoxynorbornylsilane, tethered cage, substituted cage (2-methyl-2-(triethoxysilyl)norbornane), aryl functionality (benzyl and phenyl), straight chain, and branched chain, and fluorocarbon substitutions. More so, derivatives or analogs of these compounds may also be used as co-deposited precursors in certain embodiments.

While the silicon content of the precursors of FIGS. 2A–2C is shown as single silicon atoms, it is to be understood that in other embodiments dimeric and oligomeric species, such as disilanes, diazides, silequioxanes and others, may be used. Hydrocarbon substituents may have many possible substitution patterns in such multinuclear systems.

Heteroatom substituents may serve several functions, including direction of plasma activation and energy transfer during deposition, promotion of reactivity at specific locations, as well as modulation of decomposition rate and mechanism, and the thermal and mechanical properties of the deposited film. Examples of heteroatoms and functionality include halogen, nitrogen, nitro group, diazo group, and azo group, for example.

Figure 3A:
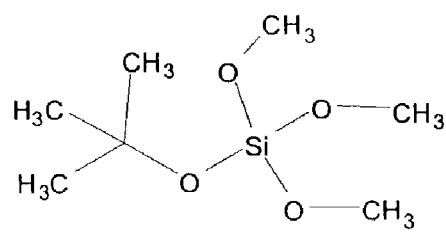
FIGS. 3A–3E are chemical structures of precursors for use in accordance with various embodiments of the present invention.
Figure 3B:
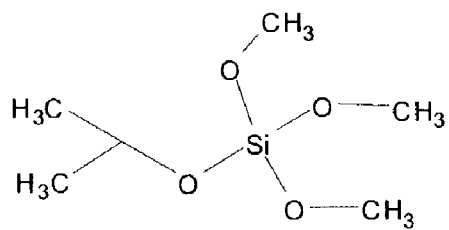
Figure 3C:
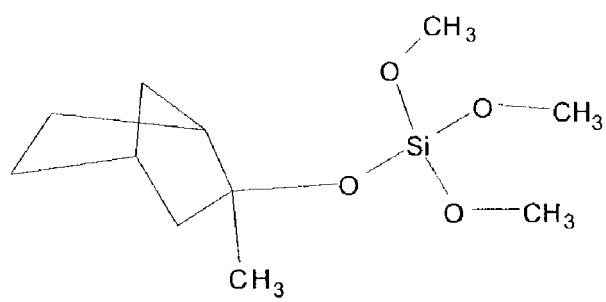
Figure 3D:
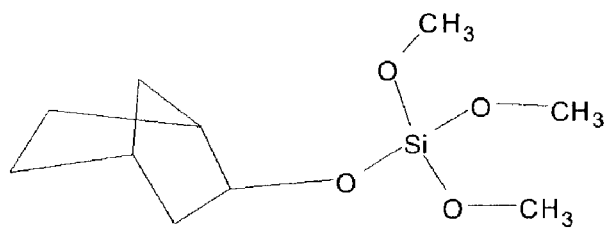
Figure 3E:
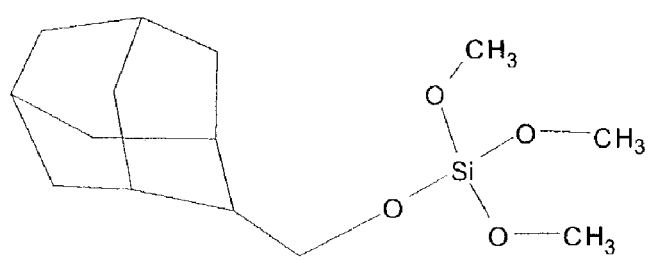

In certain embodiments, co-monomers for use as co-deposited precursors may have differing activation energies for degradation and differing amounts of hydrocarbon bulk available for loss. Referring now to FIGS. 3A–3E, shown are example precursors for use in forming dielectric layers in accordance with other embodiments of the present invention using co-deposition. As shown in FIG. 3A, in one embodiment a precursor may be tertbutoxy trimethoxysilane. As shown in FIG. 3B, in a second embodiment a precursor may be isoproxy trimethoxysilane. As shown in FIG. 3C, in a third embodiment a precursor may be alpha methyl norbornyl oxytrimethoxysilane. As shown in FIG. 3D in a fourth embodiment a precursor may be norbornyl oxytrimethoxysilane. As shown in FIG. 3E, in a fifth embodiment a precursor may be adamantyl methoxy trimethoxysilane. As shown in FIGS. 3A–3E, the hydrocarbons are bound to the silicon through a linker moiety (e.g., oxygen). In other embodiments, other derivatives or analogs may be bound to the silicon.

In one embodiment, a conventional low temperature deposition process may be used to deposit a film containing organic moieties, and a high temperature (or other energy input) decomposition process may be used later in the process (as discussed above with regard to FIGS. 1A–1D) to cause decomposition of the film, releasing the organic moiety and leaving void volume, thus enabling a lower dielectric constant film.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a dielectric layer on a substrate, said dielectric layer formed from a non-cyclic conventional precursor including a functional group that acts as a first organic porogen and from an organic precursor comprising a second organic porogen; and
   forming at least one metal interconnect in the dielectric layer prior to removing at least a portion of the first organic porogen and the second organic porogen.

2. The method of claim 1, wherein the second organic porogen comprises a large functional group.

3. The method of claim 2, wherein the large functional group is selected from the group consisting of alkyl group, benzene, naphthalene, anthracene, adamantine, norbomane, camphor, and nor camphor.

4. The method of claim 1, further comprising removing at least a portion of the first organic porogen and the second organic porogen from the dielectric layer to reduce density of the dielectric layer.

5. The method of claim 4, further comprising removing at least the portion of the first organic porogen and the second organic porogen.

6. The method of claim 1, further comprising introducing the conventional precursor having a formula [R2]4−xSi[R1]x, wherein R1 comprises a functional group to form Si—O bonds during deposition and wherein R2 comprises a bulky carbon-based group.

7. The method of claim 1, further comprising introducing the conventional precursor having a formula [R2X]4−xSi[R1]x, wherein X comprises a heteroatom, R1 comprises a functional group to form Si—O bonds during deposition and wherein R2 comprises a bulky carbon-based group.

8. The method of claim 1, wherein the second organic porogen comprises a hydrocarbon cage moiety.

9. The method of claim 8, wherein the hydrocarbon cage moiety comprises a norbornyl or adamantyl derivative.

10. The method of claim 1, wherein the second organic porogen is to physisorb on a surface of the dielectric layer.

11. The method of claim 1, wherein the organic precursor comprises a silicon-free organic precursor to form a silica network with organic material incorporated as a side chain on the silica network.

12. A method comprising:
    introducing a conventional precursor including a functional group that acts as a first organic porogen into a vapor deposition apparatus;
    introducing an organic precursor into the vapor deposition apparatus, the organic precursor comprising a second organic porogen;
    forming a dielectric layer having at least one of the first organic porogen and the second organic porogen on a substrate within the vapor deposition apparatus from the conventional precursor and the organic precursor; and
    removing at least a portion of the first organic porogen and the second organic porogen using a non-thermal removal process.

13. The method of claim 12 wherein removing at least a portion of the first organic porogen and the second organic porogen includes selectively removing using a solvent.

14. The method of claim 12 wherein removing at least a portion of the first organic porogen and the second organic porogen includes exposing to irradiation.

15. A method comprising:
    introducing a silicon-based deposition precursor including a removable functional group that acts as a first organic porogen into a vapor deposition apparatus;
    introducing another precursor into the vapor deposition apparatus, the other precursor comprising a second organic porogen having a different functional group than the first organic porogen;
    forming a dielectric layer having at least one of the first organic porogen and the second organic porogen on a substrate within the vapor deposition apparatus from the silicon-based precursor and the other precursor; and
    removing at least a portion of the first organic porogen and the second organic porogen after said dielectric layer is formed.

16. The method of claim 15 wherein introducing a silicon-based deposition precursor includes introducing a tetraethylorthosilicate-based precursor into said vapor deposition apparatus.

17. The method of claim 15 wherein introducing a silicon-based deposition precursor includes introducing a silane-based precursor into the vapor deposition apparatus.

18. A method comprising:
    providing one deposition precursor that includes a functional group that acts as a first organic porogen;
    providing another deposition precursor other than the one deposition precursor, the other deposition precursor including a silicon atom and at least one functional group that acts as a second organic porogen bonded to the silicon atom, the second organic porogen other than the first organic porogen, the deposition precursors to form a dielectric layer; and
    after the dielectric layer is formed, removing at least a portion of the first and the second organic porogens.

19. The method of claim 18 wherein providing one deposition precursor includes providing a non-cyclic conventional precursor that includes a removable functional group that acts as a first organic porogen.

20. The method of claim 18 wherein removing at least a portion of the first and second organic porogens includes removing said porogens through an overlying porous layer.

* * * * *

UNITED STATES PATENT AND TRADEMARK OFFICE
CERTIFICATE OF CORRECTION

PATENT NO. : 7,169,715 B2 Page 1 of 1
APPLICATION NO. : 10/394104
DATED : January 30, 2007
INVENTOR(S) : Andrew W. Ott et al.

It is certified that error appears in the above-identified patent and that said Letters Patent is hereby corrected as shown below:

<u>Column 5</u>:
Line 46, "norbomane" should be --norbornane--.

Signed and Sealed this

Fourteenth Day of August, 2007

JON W. DUDAS
*Director of the United States Patent and Trademark Office*